(12) United States Patent
Shin

(10) Patent No.: US 10,291,868 B2
(45) Date of Patent: May 14, 2019

(54) IMAGE SENSING DEVICE

(71) Applicant: SK hynix Inc., Gyeonggi-do (KR)

(72) Inventor: Min-Seok Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/947,365

(22) Filed: Apr. 6, 2018

(65) Prior Publication Data

US 2018/0227520 A1 Aug. 9, 2018

Related U.S. Application Data

(63) Continuation-in-part of application No. 15/177,765, filed on Jun. 9, 2016, now Pat. No. 9,967,495.

(30) Foreign Application Priority Data

Jan. 29, 2016 (KR) .......................... 10-2016-0011737

(51) Int. Cl.
| | | |
|---|---|---|
| H04N 3/14 | (2006.01) | |
| H04N 5/335 | (2011.01) | |
| H04N 5/365 | (2011.01) | |
| H04N 5/378 | (2011.01) | |
| H01L 27/146 | (2006.01) | |
| H04N 9/04 | (2006.01) | |
| H04N 5/374 | (2011.01) | |

(52) U.S. Cl.
CPC ..... H04N 5/3658 (2013.01); H01L 27/14612 (2013.01); H01L 27/14641 (2013.01); H04N 5/374 (2013.01); H04N 5/378 (2013.01); H04N 9/045 (2013.01)

(58) Field of Classification Search
CPC ..................................................... H04N 5/3745
USPC .................................................. 348/294–310
See application file for complete search history.

(56) References Cited

U.S. PATENT DOCUMENTS

| | | | | |
|---|---|---|---|---|
| 6,956,605 | B1 | 10/2005 | Hashimoto | |
| 2003/0052982 | A1* | 3/2003 | Chieh | H04N 3/1568 348/302 |
| 2003/0227552 | A1 | 12/2003 | Watanabe | |

(Continued)

FOREIGN PATENT DOCUMENTS

| | | | | |
|---|---|---|---|---|
| KR | 20100005730 A | * | 1/2010 | .......... C07D 401/14 |
| KR | 1020110085768 | | 7/2011 | |

*Primary Examiner* — Anthony J Daniels
(74) *Attorney, Agent, or Firm* — IP & T Group LLP

(57) ABSTRACT

An image sensing device includes pixel groups, each pixel group including two or more neighboring pixels and grouped into a same pattern; and a timing generator controlling the pixel groups based on one or more row units, wherein readout orders of first and second pixel groups arranged in different rows among the pixel groups are controlled differently, wherein the first pixel group reads out two or more pixel signals based on two or more first transmission control signals, wherein the second pixel group reads out two or more pixel signals based on two or more second transmission control signals, wherein the timing generator generates the first transmission control signals in a first order during one or more first row readout times, wherein the timing generator generates the second transmission control signals in a second order, which is different from the first order, during one or more second row readout times.

8 Claims, 3 Drawing Sheets

(56) References Cited

U.S. PATENT DOCUMENTS

2006/0231732 A1   10/2006   Yan
2010/0002116 A1*  1/2010   Ostlund ................ H04N 5/232
                                                            348/308

* cited by examiner

IMAGE SENSING DEVICE

CROSS-REFERENCE TO RELATED APPLICATIONS

This application is a continuation in part of U.S. patent application Ser. No. 15/177,765 filed on Jun. 9, 2016, which claims priority under 35 U.S.C. § 119 to Korean Patent Application No. 10-2016-0011737, filed on Jan. 29, 2016, in the Korean Intellectual Property Office. The disclosure of each of the foregoing applications is incorporated herein by reference in its entirety.

BACKGROUND

1. Field

Various exemplary embodiments of the present invention generally relate to a semiconductor design technique. Particularly, the embodiments relate to an image sensing device.

2. Description of the Related Art

Image sensing devices capture images using photosensitive properties of semiconductors. Image sensing devices are classified into charge-coupled device (CCD) image sensors and complementary metal-oxide semiconductor (CMOS) image sensors. CMOS image sensors allow for both analog and digital control circuits to be directly realized on a single integrated circuit (IC), and are the most widely used type of image sensors.

SUMMARY

Various embodiments of the present invention are directed to an image sensing device that diffuses a row fixed pattern noise. The fixed pattern noise may occur due to a pixel offset, for example.

In accordance with an embodiment of the present invention, an image sensing device includes: a plurality of pixel groups, each pixel group including two or more neighboring pixels and grouped into a same pattern; and a timing generator suitable for controlling the pixel groups on a basis of one or more row units, wherein readout orders of first and second pixel groups which are arranged in different rows among the pixel groups are controlled differently, wherein the first pixel group reads out two or more pixel signals based on two or more first transmission control signals, wherein the second pixel group reads out two or more pixel signals based on two or more second transmission control signals, wherein the timing generator generates the first transmission control signals in a first order during one or more first row readout times, wherein the timing generator generates the second transmission control signals in a second order, which is different from the first order, during one or more second row readout times.

In accordance with an embodiment of the present invention, an image sensing device includes: a first pixel group including two or more first pixels arranged in a first row and two or more second pixels arranged in a second row; a second pixel group including two or more third pixels arranged in a third row and two or more fourth pixels arranged in a fourth row and grouped in a same pattern as the first pixel group; and a timing generator suitable for controlling the first and second pixel groups on a basis of two row units, wherein readout orders of the first and second pixel groups are controlled differently, wherein the first pixel group reads out four or more pixel signals based on first transmission control signals corresponding to the first pixels and second transmission control signals corresponding to the second pixels, wherein the second pixel group reads out four or more pixel signals based on third transmission control signals corresponding to the third pixels and fourth transmission control signals corresponding to the fourth pixels, wherein the timing generator generates the first transmission control signals in a first order during a first row readout time and generates the second transmission control signals in a second order, which is equal to or different from the first order, during a second row readout time, wherein the timing generator generates the third transmission control signals in a third order, which is different from the first order, during a third row readout time and generates the fourth transmission control signals in the second order during a fourth row readout time.

In accordance with an embodiment of the present invention, an image sensing device includes: a first pixel group including two or more first pixels arranged in a first row and two or more second pixels arranged in a second row; a second pixel group including two or more third pixels arranged in a third row and two or more fourth pixels arranged in a fourth row and grouped in a same pattern as the first pixel group; and a timing generator suitable for controlling the first and second pixel groups on a basis of two row units, wherein readout orders of the first and second pixel groups are controlled differently, wherein the first pixel group reads out four or more pixel signals based on a plurality of first transmission control signals, wherein the second pixel group reads out four or more pixel signals based on a plurality of second transmission control signals, wherein the timing generator generates the first transmission control signals in a first order during first and second row readout times, wherein the timing generator generates the second transmission control signals in a second order, which is different from the first order, during third and fourth row readout times.

In accordance with an embodiment of the present invention, an image sensing device includes: first and second pixel groups, each grouped into a same pattern and arranged in different rows; and a timing generator suitable for generating first transmission control signals arranged in a first order during first row readout times, and generating second transmission control signals arranged in a second order during second row readout times, wherein the first pixel group reads out first pixel signals in response to the first transmission control signals, and wherein the second pixel group reads out second pixel signals in response to the second transmission control signals.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

In some instances, as would be apparent to one of ordinary skill in the art elements described in connection with a particular embodiment may be used singly or in combination with other embodiments unless otherwise specifically indicated.

Hereinafter, the various embodiments of the present invention will be described in detail with reference to the attached drawings.

Figure 1:
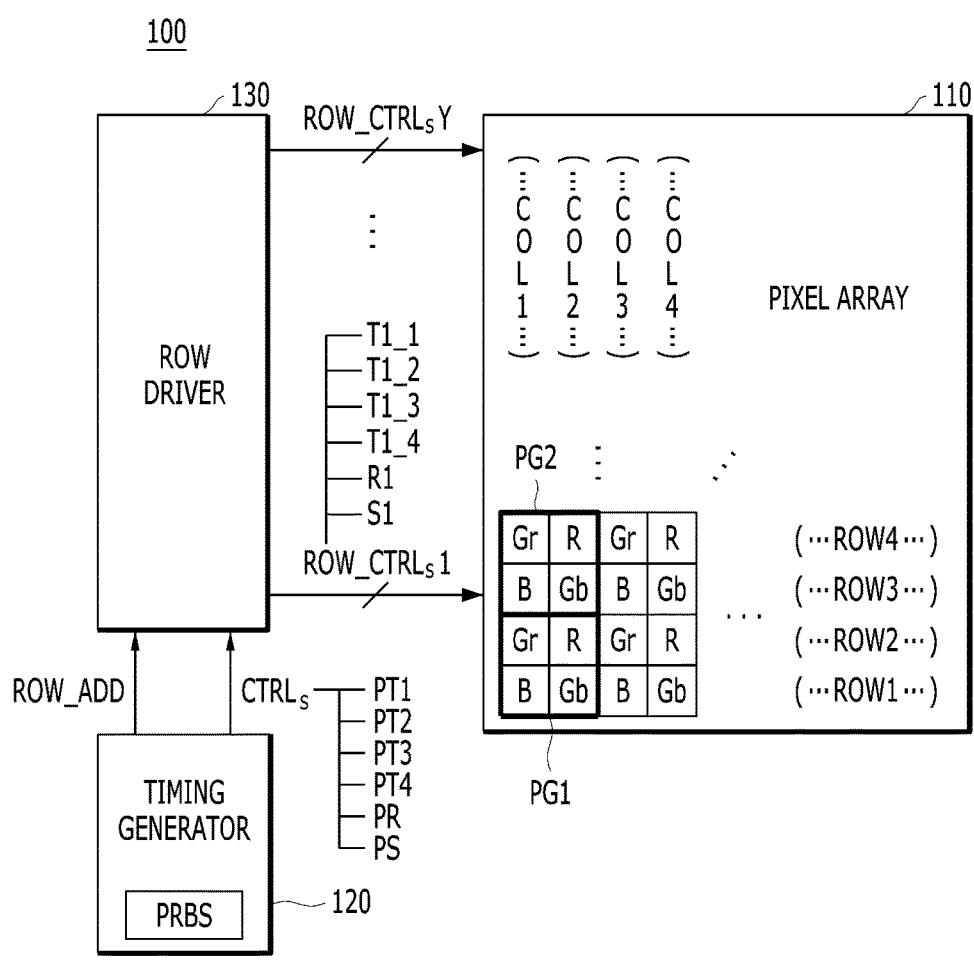
FIG. 1 is a block diagram illustrating an image sensing device in accordance with an embodiment of the present invention.

FIG. 1 is a block diagram illustrating an image sensing device 100 in accordance with an embodiment of the present invention.

Referring to FIG. 1, the image sensing device 100 may include a pixel array 110, a timing generator 120, and a row driver 130.

The pixel array 110 may have a plurality of pixels arranged in a row and a column direction. The pixels may be arranged in a predetermined pattern. For example, the pixels may be arranged in a Bayer pattern. The Bayer pattern may be formed of repeated patterns of cells each having 2*2 pixels. In each of the cells, two green-colored pixels Gr and Gb may be arranged to face each other on diagonal corners, and a red-colored pixel R and a blue-colored pixel B may be arranged on the other corners. Hereinafter, the 2*2 pixels arranged in the Bayer pattern are referred to as a "pixel group".

The 2*2 pixels arranged in first and second rows ROW1 and ROW2 and arranged in first and second columns COL1 and COL2 among a plurality of pixel groups included in the pixel array 110 are referred to as a "first pixel group PG1", and the 2*2 pixels arranged in third and fourth rows ROW3 and ROW4 and arranged in the first and second columns COL1 and COL2 are referred to as a "second pixel group PG2".

The timing generator 120 may control the pixel array 110 on a basis of one or more row units. For example, the timing generator 120 may control the pixel array 110 on a basis of two row units as the pixel group (e.g., each of the first and second pixel groups PG1 and PG2) includes the 2*2 pixels.

The timing generator 120 may differently control readout orders of pixel groups which are not arranged in the same row and are arranged in different rows among the pixel groups. For example, the timing generator 120 may differently control readout orders of the first and second pixel groups PG1 and PG2.

In addition, the timing generator 120 may differently control initialization orders of the pixel groups which are not arranged in the same row and are arranged in different rows among the pixel groups. For example, the timing generator 120 may differently control initialization orders of the first and second pixel groups PG1 and PG2.

However, the timing generator 120 may control the initialization order and the readout order for each pixel group in the same manner. This is for maintaining the same exposure time (ET) for each unit row time.

The timing generator 120 may generate a row address signal ROW_ADD, first to fourth transmission control signals PT1, PT2, PT3, and PT4, a reset control signal PR, and a selection control signal PS for controlling the pixel array 110 on a basis of two row units. For example, the timing generator 120 may generate the row address signal ROW_ADD corresponding to first and second unit row times, the first to fourth transmission control signals PT1, PT2, PT3, and PT4 corresponding to the first pixel group, the reset control signal PR and the selection control signal PS. Then, the timing generator 120 may generate the row address signal ROW_ADD corresponding to third and fourth unit row times, the first to fourth transmission control signals PT1, PT2, PT3, and PT4 corresponding to the second pixel group, the reset control signal PR and the selection control signal PS.

The timing generator 120 may include a pseudo random bit sequence (PRBS) circuit. The PRBS circuit may differently change an activation order of some or all of the first to fourth transmission control signals PT1, PT2, PT3 and PT4 for each unit row time depending on design.

For example, the PRBS circuit may randomly change just the activation order of the first and second transmission control signals PT1 and PT2 corresponding to first and second pixels arranged in odd-numbered rows among the first to fourth transmission control signals PT1, PT2, PT3, and PT4 for each unit row time.

For example, the PRBS circuit may randomly change just the activation order of the third and fourth transmission control signals PT3 and PT4 corresponding to third and fourth pixels arranged in even-numbered rows among the first to fourth transmission control signals PT1, PT2, PT3, and PT4 for each unit row time.

For example, the PRBS circuit may randomly change the activation order of the first to fourth transmission control signals PT1, PT2, PT3, and PT4 for each unit row time.

In the embodiment of the present invention, it is exemplified that the PRBS circuit is included in the timing generator 120. However, the present invention is not limited thereto, and the PRBS circuit may be configured outside the timing generator 120. In addition, although the PRBS circuit is described as an example in the embodiment of the present invention, the present invention is not limited thereto, and any circuit capable of changing the activation order of corresponding signals is applicable.

The row driver 130 may sequentially generate first to $Y^{th}$ row control signals ROW_CTRLs1 to ROW_CTRLsY based on the row address signal ROW_ADD, the first to fourth transmission control signals PT1, PT2, PT3, and PT4, the reset control signal PR, and the selection control signal PS.

Each of the first to $Y^{th}$ row control signals ROW_CTRLs1 to ROW_CTRLsY may control the pixels arranged in two rows. For example, the first row control signal ROW_CTRLs1 may include first driven transmission control signals T1_1, T1_2, T1_3, and T1_4, a first driven reset control signal R1, and a first driven selection control signal S1 for simultaneously controlling the pixels arranged in the first row ROW1 and the second row ROW2. For example, the second row control signal ROW_CTRLs2 may include second driven transmission control signals T2_1, T2_2, T2_3 and T2_4, a second driven reset control signal R2 and a second driven selection control signal S2 for simultaneously controlling the pixels arranged in the third row ROW3 and the fourth ROW4.

Figure 2:
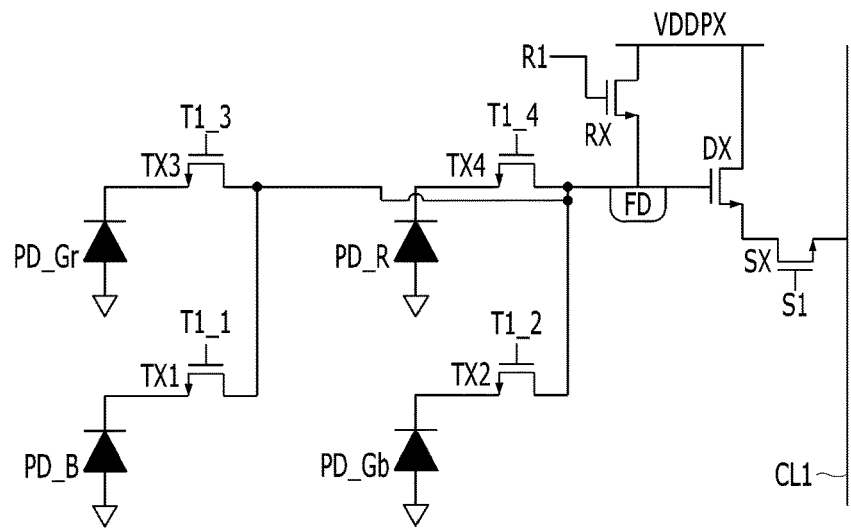
FIG. 2 is a circuit diagram illustrating an example configuration of a first pixel group shown in FIG. 1.

FIG. 2 is a circuit diagram illustrating an example configuration of the first pixel group PG1 among the plurality of pixel groups shown in FIG. 1.

Referring to FIG. 2, four pixels included in the first pixel group PG1 may have a partial-pixel shared structure. For example, the first pixel group PG1 may have a four-pixel shared structure. The first pixel group PG1 may include first to fourth photo diodes PD_B, PD_Gb, PD_Gr, and PD_R, first to fourth transmission units TX1, TX2, TX3, and TX4, a floating diffusion node FD, an initialization unit RX, a driving unit DX, and a selection unit SX.

The first photo diode PD_B may correspond to the blue-colored pixel B. For example, the first photo diode PD_B may generate a photocharge corresponding to incident light during a first exposure time. The first exposure time may range from a moment when a first initialization time terminates to a moment when a first transmission time starts. During the first initialization time, a photocharge remaining in the first photo diode PD_B is discharged into a driving voltage VDDPX terminal. During the first transmission time, the photocharge generated in the first photo diode PD_B is transmitted to the floating diffusion node FD.

The second photo diode PD_Gb may correspond to the green-colored pixel Gb. For example, the second photo diode PD_Gb may generate a photocharge corresponding to incident light during a second exposure time. The second exposure time may range from a moment when a second initialization time terminates to a moment when a second transmission time starts. During the second initialization time, a photocharge remaining in the second photo diode PD_Gb is discharged into the driving voltage VDDPX terminal, and during the second transmission time, the photocharge generated in the second photo diode PD_Gb is transmitted to the floating diffusion node FD.

The third photo diode PD_Gr may correspond to the green-colored pixel Gr. For example, the third photo diode PD_Gr may generate a photocharge corresponding to incident light during a third exposure time. The third exposure time may range from a moment when a third initialization time terminates to a moment when a third transmission time starts. During the third initialization time, a photocharge remaining in the third photo diode PD_Gr is discharged into the driving voltage VDDPX terminal, and during the third transmission time, the photocharge generated in the third photo diode PD_Gr is transmitted to the floating diffusion node FD.

The fourth photo diode PD_R may correspond to the red-colored pixel R. For example, the red-colored pixel R may generate a photocharge corresponding to incident light during a fourth exposure time. The fourth exposure time may range from a moment when a fourth initialization time terminates to a moment when a fourth transmission time starts. During the fourth initialization time, a photocharge remaining in the fourth photo diode PD_R is discharged into the driving voltage VDDPX terminal, and during the fourth transmission time, the photocharge generated in the fourth photo diode PD_R is transmitted to the floating diffusion node FD.

The first transmission unit TX1 may be formed between the first photo diode PD_B and the floating diffusion node FD. For example, the first transmission unit TX1 may be enabled along with the initialization unit RX and may transmit the photocharge remaining in the first photo diode PD_B to the driving voltage VDDPX terminal through the initialization unit RX, in response to the first driven transmission control signal T1_1 during the first initialization time. In addition, the first transmission unit TX1 may transmit the photocharge generated in the first photo diode PD_B to the floating diffusion node FD, in response to the first driven transmission control signal T1_1 during the first transmission time. The first transmission unit TX1 may include an NMOS transistor having a gate to which the first driven transmission control signal T1_1 is inputted and a drain and a source coupled between the floating diffusion node FD and the first photo diode PD_B, respectively.

The second transmission unit TX2 may be formed between the second photo diode PD_Gb and the floating diffusion node FD. For example, the second transmission unit TX2 may be enabled along with the initialization unit RX and may transmit the photocharge remaining in the second photo diode PD_Gb to the driving voltage VDDPX terminal through the initialization unit RX, in response to the first driven transmission control signal T1_2 during the second initialization time. In addition, the second transmission unit TX2 may transmit the photocharge generated in the second photo diode PD_Gb to the floating diffusion node FD, in response to the first driven transmission control signal T1_2 during the second transmission time. The second transmission unit TX2 may include an NMOS transistor having a gate to which the first driven transmission control signal T1_2 is inputted and a drain and a source coupled between the floating diffusion node FD and the second photo diode PD_Gb, respectively.

The third transmission unit TX3 may be formed between the third photo diode PD_Gr and the floating diffusion node FD. For example, the third transmission unit TX3 may be enabled along with the initialization unit RX and may transmit the photocharge remaining in the third photo diode PD_Gr to the driving voltage VDDPX terminal through the initialization unit RX, in response to the first driven transmission control signal T1_3 during the third initialization time. In addition, the third transmission unit TX3 may transmit the photocharge generated in the third photo diode PD_Gr to the floating diffusion node FD, in response to the first driven transmission control signal T1_3 during the third transmission time. The third transmission unit TX3 may include an NMOS transistor having a gate to which the first driven transmission control signal T1_3 is inputted and a drain and a source coupled between the floating diffusion node FD and the third photo diode PD_Gr, respectively.

The fourth transmission unit TX4 may be formed between the fourth photo diode PD_R and the floating diffusion node FD. For example, the fourth transmission unit TX4 may be enabled along with the initialization unit RX and may transmit the photocharge remaining in the fourth photo diode PD_R to the driving voltage VDDPX terminal through the initialization unit RX, in response to the first driven transmission control signal T1_4 during the fourth initialization time. In addition, the fourth transmission unit TX4 may transmit the photocharge generated in the fourth photo diode PD_R to the floating diffusion node FD, in response to the first driven transmission control signal T1_4 during the fourth transmission time. The fourth transmission unit TX4 may include an NMOS transistor having a gate to which the first driven transmission control signal T1_4 is inputted and a drain and a source coupled between the floating diffusion node FD and the fourth photo diode PD_R, respectively.

The floating diffusion node FD may accumulate the photocharge. For example, a junction capacitor (not illustrated) may be coupled to the floating diffusion node FD, and the photocharge may be accumulated in the junction capacitor.

The initialization unit RX may initialize the floating diffusion node FD, in response to the first driven reset control signal R1 during the first to fourth initialization times. For example, the initialization unit RX may discharge the photocharges transmitted through the first to fourth transmission units TX1, TX2, TX3, and TX4 into the driving voltage VDDPX terminal while discharging the photocharge remaining in the junction capacitor into the driving voltage VDDPX terminal. In addition, the initialization unit RX may initialize the floating diffusion node FD, in response to the first driven reset control signal R1 during first to fourth reference times before the first to fourth transmission times. The initialization unit RX may include an NMOS transistor having a gate to which the first driven reset control signal R1 is inputted and a drain and a source coupled between the driving voltage VDDPX terminal and the floating diffusion node FD, respectively.

The driving unit DX may drive a pixel signal with a driving voltage VDDPX based on a voltage loaded on the floating diffusion node FD. For example, the driving unit DX may generate a first reference signal corresponding to the driving voltage VDDPX as the pixel signal during the first reference time, and generate a first data signal corresponding to the photocharge of the first photo diode PD_B as the pixel signal during the first transmission time. The driving unit DX may generate a fourth reference signal corresponding to the driving voltage VDDPX as the pixel signal during the fourth reference time, and generate a fourth data signal corresponding to the photocharge of the fourth photo diode PD_R as the pixel signal during the fourth transmission time. The driving unit DX may include an NMOS transistor having a gate coupled to the floating diffusion node FD and a drain and a source coupled between the driving voltage VDDPX terminal and the selection unit SX.

The selection unit SX may transmit the pixel signal to a first column line COL1, in response to the first selection control signal S1. For example, the selection unit SX may include an NMOS transistor having a gate to which the first selection control signal S1 is inputted and a drain and a source coupled between the driving unit DX and the first column line COL1.

Figure 3:
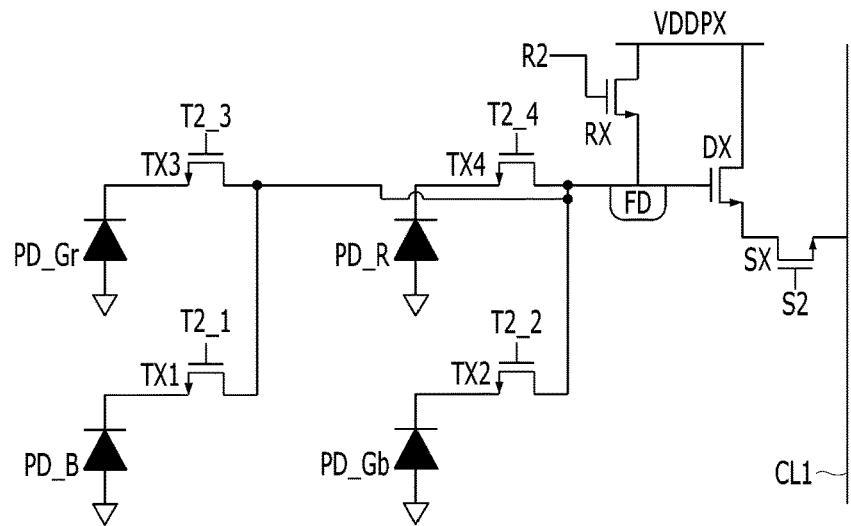
FIG. 3 is a circuit diagram illustrating an example configuration of a second pixel group shown in FIG. 1.

FIG. 3 is a circuit diagram illustrating an example configuration of the second pixel group PG2 among the plurality of pixel groups shown in FIG. 1.

Referring to FIG. 3, the second pixel group PG2 may operate based on the second driven transmission control signals T2_1, T2_2, T2_3 and T2_4, the second driven reset control signal R2 and the second driven selection control signal S2, and share the first column line CL1 with the first pixel group PG1. Since the second pixel group PG2 has substantially the same structure as the first pixel group PG1, detailed descriptions on the second pixel group PG2 will be omitted.

Hereinafter, an operation of the image sensing device 100 having the aforementioned structure is described below with reference to FIGS. 4 and 5.

For convenience of description, operations of the first and second pixel groups PG1 and PG2 during a unit frame time FT are representatively described, as an example.

Figure 4:
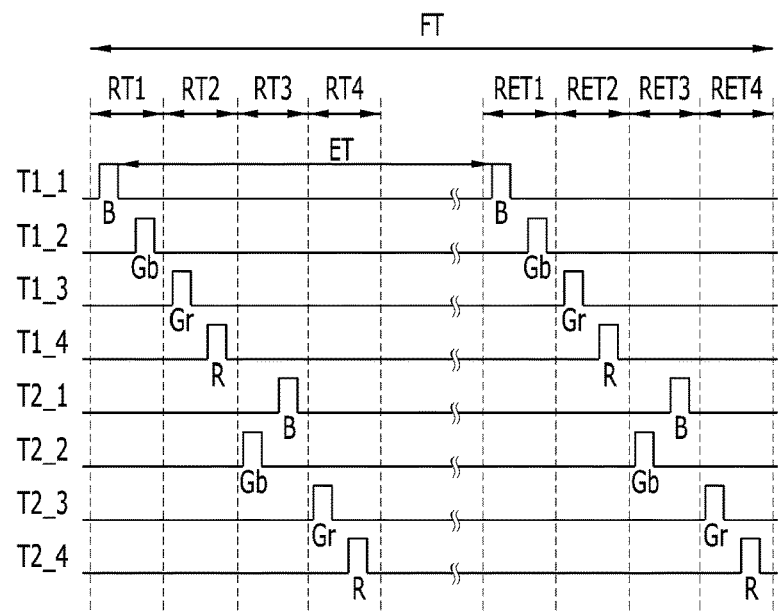
FIG. 4 is a timing diagram for an operation of the image sensing device shown in FIG. 1, according to an embodiment of the present invention.

FIG. 4 is a timing diagram for the operation of the image sensing device 100 shown in FIG. 1, according to an embodiment of the present invention.

Referring to FIG. 4, the image sensing device 100 may initialize and read out the first pixel group PG1 based on a first order during the unit frame time FT, and initialize and read out the second pixel group PG2 based on a second order, which is different from the first order, during the unit frame time FT.

For example, the image sensing device 100 may randomly change the initialization order and readout order of the pixels arranged in the odd-numbered rows ROW1 and ROW3 among the pixels included in the first and second pixel groups PG1 and PG2.

First, the operation of the first pixel group PG1 is described in detail.

The timing generator 120 may generate the first to fourth transmission control signals PT1, PT2, PT3, and PT4 based on the first order during first and second row initialization times RT1 and RT2.

For example, the timing generator 120 may sequentially generate the first to fourth transmission control signals PT1, PT2, PT3, and PT4 during the first and second row initialization times RT1 and RT2, and sequentially generate the first to fourth transmission control signals PT1, PT2, PT3, and PT4 during first and second row readout times RET1 and RET2.

In other words, the timing generator 120 may activate the first transmission control signal PT1 during the first initialization time of the first row initialization time RT1, and activate the second transmission control signal PT2 during the second initialization time of the first row initialization time RT1. The timing generator 120 may activate the third transmission control signal PT3 during the third initialization time of the second row initialization time RT2, and activate the fourth transmission control signal PT4 during the fourth initialization time of the second row initialization time RT2.

In addition, the timing generator 120 may activate the first transmission control signal PT1 during the first transmission time of the first row readout time RET1, and activate the second transmission control signal PT2 during the second transmission time of the first row readout time RET1. The timing generator 120 may activate the third transmission control signal PT3 during the third transmission time of the second row readout time RET2, and activate the fourth transmission control signal PT4 during the fourth transmission time of the second row readout time RET2.

A time ranging from a moment when the first to fourth transmission control signals PT1, PT2, PT3, and PT4 generated during the first and second row initialization times RT1 and RT2 are deactivated to a moment when the first to fourth transmission control signals PT1, PT2, PT3, and PT4 generated during the first and second row readout times RET1 and RET2 are activated may be referred to as an exposure time ET, and the first to fourth photo diodes PD_B, PD_Gb, PD_Gr, and PD_R may generate the photocharge during each exposure time ET.

Although not illustrated, the timing generator 120 may generate the reset control signal PR corresponding to the first to fourth transmission control signals PT1, PT2, PT3, and PT4 during the first and second row initialization times RT1 and RT2.

For example, the timing generator 120 may activate the reset control signal PR during the first to fourth initialization times. In addition, the timing generator 120 may generate the reset control signal PR corresponding to the first to fourth transmission control signals PT1, PT2, PT3, and PT4 during the first and second row readout times RET1 and RET2. For example, the timing generator 120 may activate the reset control signal PR during the first to fourth reference times before the first to fourth transmission times.

Further, the timing generator 120 may generate the selection control signal PS during the first and second row readout times RET1 and RET2. For example, the timing generator 120 may activate the selection control signal PS during a time including the first reference time and the first transmission time, a time including the second reference time and the second transmission time, a time including the third reference time and the third transmission time, and a time including the fourth reference time and the fourth transmission time.

The row driver 130 may generate the first driven transmission control signals T1_1, T1_2, T1_3, and T1_4, the first driven reset control signal R1 and the first driven selection control signal S1 based on the row address signal ROW_ADD, the first to fourth transmission control signals PT1, PT2, PT3, and PT4, the reset control signal PR and the selection control signal PS.

The first pixel group PG1 may initialize the first to fourth photo diodes PD_B, PD_Gb, PD_Gr and PD_R according to the first order during the first and second row initialization times RT1 and RT2, and may read out first to fourth pixel signals corresponding to the first to fourth photo diodes PD_B, PD_Gb, PD_Gr, and PD_R according to the first order during the first and second row readout times RET1 and RET2, in response to the first driven reset control signal R1, the first driven transmission control signals T1_1, T1_2, T1_3, and T1_4 and the first driven selection control signal S1.

Next, an operation of the second pixel group PG2 is described in detail.

The timing generator 120 may generate the first to fourth transmission control signals PT1, PT2, PT3, and PT4 based on the second order during third and fourth row initialization times RT3 and RT4.

For example, the timing generator 120 may generate the first and second transmission control signals PT1 and PT2 in reverse order during the third row initialization time RT3 and subsequently, may sequentially generate the third and fourth transmission signals PT3 and PT4 during the fourth row initialization time RT4. The timing generator 120 may generate the first and second transmission control signals PT1 and PT2 in reverse order during a third row readout time RET3 and subsequently, may sequentially generate the third and fourth transmission control signals PT3 and PT4 during a fourth row readout time RET4.

In other words, the timing generator 120 may activate the second transmission control signal PT2 during a first initialization time of the third row initialization time RT3, and activate the first transmission control signal PT1 during a second initialization time of the third row initialization time RT3. The timing generator 120 may activate the third transmission control signal PT3 during a third initialization time of the fourth row initialization time RT4, and activate the fourth transmission control signal PT4 during a fourth initialization time of the fourth row initialization time RT4.

In addition, the timing generator 120 may activate the second transmission control signal PT2 during a first transmission time of the third row readout time RET3, and activate the first transmission control signal PT1 during a second transmission time of the third row readout time RET3. The timing generator 120 may activate the third transmission control signal PT3 during a third transmission time of the fourth row readout time RET4, and activate the fourth transmission control signal PT4 during a fourth transmission time of the fourth row readout time RET4.

Although not illustrated, the timing generator 120 may generate the reset control signal PR corresponding to the first to fourth transmission control signals PT1, PT2, PT3, and PT4 during the third and fourth row initialization times RT3 and RT4 and third and fourth row readout times RET3 and RET4, and generate the selection control signal PS during the third and fourth row readout times RET3 and RET4.

The row driver 130 may generate the second driven transmission control signals T2_1, T2_2, T2_3, and T2_4, the second driven reset control signal R2 and the second driven selection control signal S2 based on the row address signal ROW_ADD, the first to fourth transmission control signals PT1, PT2, PT3, and PT4, the reset control signal PR and the selection control signal PS.

The second pixel group PG2 may initialize the first to fourth photo diodes PD_B, PD_Gb, PD_Gr, and PD_R according to the second order during the third and fourth row initialization times RT3 and RT4, and may read out first to fourth pixel signals corresponding to the first to fourth photo diodes PD_B, PD_Gb, PD_Gr, and PD_R according to the second order during the third and fourth row readout times RET3 and RET4, in response to the second driven reset control signal R2, the second driven transmission control signals T2_1, T2_2, T2_3, and T2_4 and the second driven selection control signal S2.

Figure 5:
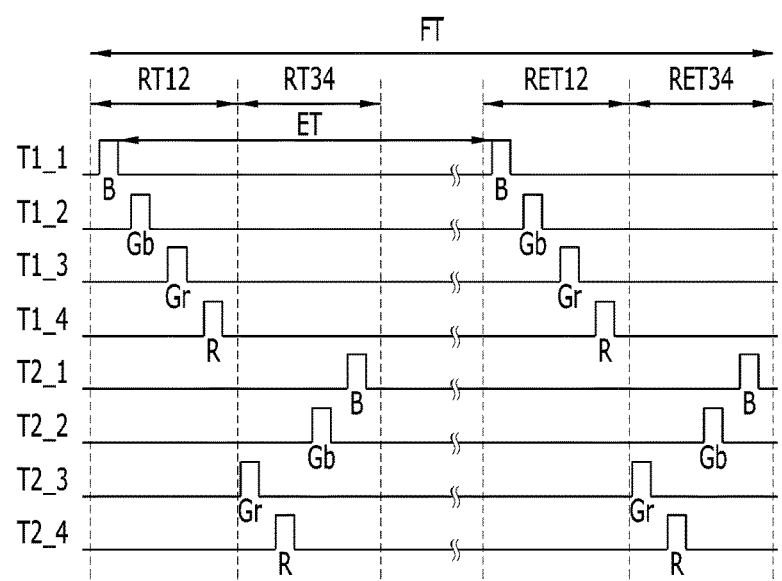
FIG. 5 is a timing diagram for an operation of the image sensing device shown in FIG. 1, according to another embodiment of the present invention.

FIG. 5 is another timing diagram for an operation of the image sensing device 100 shown in FIG. 1, according to another embodiment of the present invention.

Referring to FIG. 5, the image sensing device 100 may initialize and read out the first pixel group PG1 based on a first order during the unit frame time FT, and initialize and read out the second pixel group PG2 based on a second order, which is different from the first order, during the unit frame time FT.

For example, the image sensing device 100 may randomly change the initialization order and readout order of all the pixels included in the first and second pixel groups PG1 and PG2.

Since the operation of the image sensing device 100 shown in FIG. 5 is substantially the same as the operation of the image sensing device 100 shown in FIG. 4, a detailed description thereof is omitted. However, the image sensing device 100 shown in FIG. 5, as described above, may randomly change the initialization order and readout order of all the pixels included in the first and second pixel groups PG1 and PG2, differently from the image sensing device 100 shown in FIG. 4.

According to the embodiments of the present invention, as readout orders of pixels included in a pixel group are changed differently for each row, row fixed pattern noise occurring due to a pixel offset may be diffused.

According to the embodiments of the present invention, as row fixed pattern noise occurring due to a pixel offset is diffused, image quality of an image sensing device may be improved.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

For example, although an image sensing device including a pixel group of a four-pixel shared structure is described in the embodiments of the present invention, the inventive concept is not limited to this and may apply to an image sensing device including a pixel group of a two or more-pixel shared structure according to this invention.

What is claimed is:

1. An image sensing device, comprising:
a first pixel group including two or more first pixels arranged in a first row and two or more second pixels arranged in a second row;
a second pixel group including two or more third pixels arranged in a third row and two or more fourth pixels arranged in a fourth row and grouped in a same pattern as the first pixel group; and
a timing generator suitable for controlling the first and second pixel groups on a basis of two row units, wherein readout orders of the first and second pixel groups are controlled differently,
wherein the first pixel group reads out four or more pixel signals based on first transmission control signals corresponding to the first pixels and second transmission control signals corresponding to the second pixels,
wherein the second pixel group reads out four or more pixel signals based on third transmission control signals corresponding to the third pixels and fourth transmission control signals corresponding to the fourth pixels,
wherein the timing generator generates the first transmission control signals in a first order during a first row readout time and generates the second transmission control signals in a second order, which is equal to or different from the first order, during a second row readout time,
wherein the timing generator generates the third transmission control signals in a third order, which is different from the first order, during a third row readout time and generates the fourth transmission control signals in the second order during a fourth row readout time.

2. The image sensing device of claim 1, wherein the first and third rows are odd-numbered rows, and the second and fourth rows are even-numbered rows.

3. The image sensing device of claim 1, wherein the first and third rows are even-numbered rows, and the second and fourth rows are odd-numbered rows.

4. The image sensing device of claim 1, wherein the pixels included in each of the pixel groups are partially shared.

5. The image sensing device of claim 1, wherein each of the pixel groups includes:
two or more photo diodes;
two or more transmitters selectively transmitting a photocharge generated in the photo diodes to a floating diffusion node;
an initializer initializing the floating diffusion node;
a driver driving a pixel signal with a driving voltage based on a voltage loaded on the floating diffusion node; and
a selector transmitting the pixel signal to a column line.

6. The image sensing device of claim 1, wherein the timing generator includes a pseudo random bit sequence (PRBS) circuit.

7. The image sensing device of claim 1, wherein the timing generator controls initialization orders of the first and second pixel groups differently.

8. The image sensing device of claim 7, wherein the timing generator controls the readout order of the first pixel group in the same manner as the initialization order of the first pixel group, and controls the readout order of the second pixel group in manner the same as the initialization order of the second pixel group.

* * * * *